US007826225B2

(12) United States Patent
Katada et al.

(10) Patent No.: US 7,826,225 B2
(45) Date of Patent: Nov. 2, 2010

(54) EXPANSION TANK DEVICE, PROCESS FOR FABRICATING EXPANSION TANK DEVICE, AND LIQUID COOLING RADIATOR (75) Inventors: Yoshinori Katada, Kitaadachi-gun (JP); Kazuo Taga, Oyama (JP); Tomotaka Ishida, Minato-ku (JP); Sakae Kitajo, Minato-ku (JP)

(73) Assignees: Showa Denko K.K., Tokyo (JP); NEC Corporation, Tokyo (JP)

( * ) Notice: Subject to any disclaimer, the term of this patent is extended or adjusted under 35 U.S.C. 154(b) by 519 days.

(21) Appl. No.: 10/578,782

(22) PCT Filed: Nov. 11, 2004

(86) PCT No.: PCT/JP2004/017117

§ 371 (c)(1),
(2), (4) Date: Mar. 20, 2009

(87) PCT Pub. No.: WO2005/045333

PCT Pub. Date: May 19, 2005

(65) Prior Publication Data

US 2010/0039767 A1 Feb. 18, 2010

Related U.S. Application Data (60) Provisional application No. 60/520,281, filed on Nov. 17, 2003, provisional application No. 60/520,282, filed on Nov. 17, 2003, provisional application No. 60/598,050, filed on Aug. 3, 2004.

(30) Foreign Application Priority Data

Nov. 11, 2003 (JP) ............................. 2003-380869
Nov. 11, 2003 (JP) ............................. 2003-380876
Jul. 26, 2004 (JP) ............................. 2004-216732

(51) Int. Cl.
*H05K 7/20* (2006.01)
*G06F 1/20* (2006.01)

(52) U.S. Cl. ............. 361/699; 361/679.53; 361/679.54; 361/679.55; 361/702; 361/704; 165/104.33; 165/185

(58) Field of Classification Search ............ 361/679.46, 361/679.53–679.55, 699, 702, 704; 165/80.4, 165/104.33, 185
See application file for complete search history.

(56) References Cited

U.S. PATENT DOCUMENTS 2,064,141 A * 12/1936 Askin .................... 29/890.035

(Continued)

FOREIGN PATENT DOCUMENTS

JP 2000-002493 1/2000

(Continued)

*Primary Examiner*—Jayprakash N Gandhi
*Assistant Examiner*—Robert J Hoffberg
(74) *Attorney, Agent, or Firm*—Oblon, Spivak, McClelland, Maier & Neustadt, L.L.P.

(57) ABSTRACT

An expansion tank device 14 comprises a tank installation base 16 having a cooling liquid channel 17 and an expansion tank 18 provided on the upper surface of the installation base 16. The base 16 has a communication hole 19 for holding space above the upper surface thereof in communication with the cooling liquid channel 17. The expansion tank 18 has a tank main body 21 including an upwardly bulging portion 22 having an opening at its lower end, and a bottom plate 23 joined to the lower end of the tank main body 21 for closing the lower-end opening of the bulging portion 22 and joined to the upper surface of the tank installation base 16. The bottom plate 23 is provided at a portion thereof corresponding to the communication hole 19 with a through hole 25 communicating with the communication hole 19. The bottom plate 23 is provided with a baffle plate 26 formed along the entire circumference of the inner peripheral edge thereof defining the through hole 25 and slanting upwardly toward the center of the through hole 25. The expansion tank device 14 removes the air in the cooling liquid from the circulating system, precludes the system from breaking and prevents the decrease in the amount of cooling liquid within the circulating system.

33 Claims, 8 Drawing Sheets

U.S. PATENT DOCUMENTS

| | | | |
|---|---|---|---|
| 6,587,336 B2 * | 7/2003 | Chu et al. | 361/679.47 |
| 6,661,658 B2 * | 12/2003 | Capriz et al. | 361/690 |
| 6,757,169 B2 * | 6/2004 | Kondo et al. | 361/699 |
| 6,795,312 B2 * | 9/2004 | Narakino et al. | 361/679.53 |
| 6,885,556 B2 * | 4/2005 | Kondo et al. | 361/699 |
| 6,942,019 B2 * | 9/2005 | Pikovsky et al. | 165/80.4 |
| 6,947,282 B2 * | 9/2005 | Hotta et al. | 361/699 |
| 7,417,857 B2 * | 8/2008 | Rondier et al. | 361/699 |
| 2009/0050301 A1 * | 2/2009 | Ishida et al. | 165/104.33 |

FOREIGN PATENT DOCUMENTS

| | | |
|---|---|---|
| JP | 2000-022376 | 1/2000 |
| JP | 2003007944 A * | 1/2003 |
| JP | 2003-078271 | 3/2003 |
| JP | 2003-185369 | 7/2003 |
| JP | 2005026498 A * | 1/2005 |
| JP | 2007200957 A * | 8/2007 |
| WO | WO 03028422 A1 * | 4/2003 |

* cited by examiner

EXPANSION TANK DEVICE, PROCESS FOR FABRICATING EXPANSION TANK DEVICE, AND LIQUID COOLING RADIATOR

CROSS REFERENCE TO RELATED APPLICATIONS

This application is an application filed under 35 U.S.C. §111(a) claiming the benefit pursuant to 35 U.S.C. §119(e)(1) of the filing date of Provisional Applications No. 60/520,281, No. 60/520,282, and No. 60/598,050 filed Nov. 17, 2003, Nov. 17, 2003 and Aug. 3, 2004, respectively, pursuant to 35 U.S.C. §111(b).

TECHNICAL FIELD

The present invention relates to expansion tank devices for use in devices for dissipating the heat generated by heat sources provided in IT devices, such as personal computers and servers, AV devices, industrial machines, tool machines, etc., a process for fabricating the expansion tank device, and liquid cooling radiators having the expansion tank device.

The term "aluminum" as used herein and in the appended claims includes aluminum alloys in addition to pure aluminum. Further the term "upper" and "lower" refer respectively to the upper and lower sides of FIG. 1.

BACKGROUND ART

As a method widely used for dissipating the heat generated by heat sources provided, for example, in personal computers, servers and the like, it is practice to use a device comprising a radiant aluminum base plate having one side serving as a heat receiving surface and radiant fins provided on the other side of the plate integrally therewith, by holding the heat receiving surface of the base plate in contact with the heat source and applying a stream of air to the radiant fins with a fan to release the heat emitted by the heat source into the air through the base plate and the fins.

However, personal computers and servers, for example, recently have found an increased number of applications which require high-speed processing, while more multimedia applications such as music and moving video pictures have become available. For this reason, central processing units (hereinafter referred to as "CPUs"), for example, are becoming higher in operating frequency and generate markedly increased amounts of heat. The reduction of noise is also required of such devices. Accordingly, sufficient radiation performance has become no longer available by the method described above, which also fails to achieve the reduction in noise as required.

Also in wide use is a method of releasing heat into the atmosphere utilizing heat pipes with use of a chlorofluorocarbon working fluid for dispersing the heat emitted by heat sources, for example, of industrial machines, tool machines, etc.

Nevertheless, a changeover to cooling systems wherein no chlorofluorocarbon is used has been required from the viewpoint of the protection of the global environment.

To overcome these problems, liquid cooling radiators have been placed into use wherein use is made of a cooing liquid consisting mainly of water, such as an antifreeze solution.

For use in notebook personal computers, a liquid cooling radiator has been proposed which consists of a heat receiving unit comprising a water jacket filled with a cooling liquid and fixed to a heat generating electronic component, and a cooling liquid circulating tube having opposite ends connected to the heat receiving unit for circulating the cooling liquid therethrough. The heat receiving unit and the circulating tube have an antifreeze solution enclosed therein. The heat receiving unit is disposed in the main body of the personal computer which has a keyboard, and the circulating tube extends to a display unit which is openably provided on the main body. The display unit has a corner portion positioned above the main body when the display unit is opened and provided with a reserve tank in communication with the circulating tube (see the publication of JP-A No. 2002-182797). With this liquid cooling radiator, the reserve tank functions to absorb the thermal expansion of the cooling liquid when the liquid is heated with the heat received from the heat source. The reserve tank also serves to replenish the cooling liquid when the amount of the liquid decreases.

For the liquid cooling radiator to achieve an improved cooling efficiency, it is required to remove air in the cooling liquid from the cooling system to the greatest possible extent. However, with the radiator disclosed in the above publication, the air in the reserve tank ingresses into the circulating tube when the display unit is closed, and it is difficult to return the air to the reserve tank when the display unit is opened, so that the radiator has the problem of being lower in cooling efficiency.

An object of the present invention is to solve this problem and to provide an expansion tank device which is adapted to remove the air in the cooling liquid from the circulating system, to prevent the circulating system from breaking and to prevent the decrease in the amount of cooling liquid within the circulating system, the object of the invention further being to provide a process for fabricating the expansion tank device and a liquid cooling radiator.

DISCLOSURE OF THE INVENTION

To fulfill the above object, the present invention comprises the following modes.

1) An expansion tank device comprising a tank installation base having a cooling liquid channel and an expansion tank provided on an upper surface of the installation base, the tank installation base having a communication hole for holding space above the upper surface thereof in communication with the cooling liquid channel, the expansion tank having a tank main body including an upwardly bulging portion having an opening at a lower end thereof, and a bottom plate joined to a lower end of the tank main body for closing the lower-end opening of the bulging portion and joined to the upper surface of the tank installation base, the bottom plate of the expansion tank being provided at a portion thereof corresponding to the communication hole with a through hole communicating with the communication hole of the tank installation base, the bottom plate being provided with a baffle plate formed along the entire circumference of an inner peripheral edge thereof defining the through hole and slanting upwardly toward a central portion of the through hole.

2) An expansion tank device described in par. 1) wherein the tank installation base is made by joining upper and lower two base forming sheets as superposed on each other, and the cooling liquid channel is formed between the upper and lower two base forming sheets by downwardly bulging the lower base forming sheet, the communication hole being formed in the upper base forming sheet.

3) An expansion tank device described in par. 2) wherein the upper and lower two base forming sheets are each made of a metal, and the upper and lower two base forming sheets are joined by brazing.

4) An expansion tank device described in par. 2) wherein the upper and lower two base forming sheets are each made of aluminum, and are brazed with a brazing material layer formed on at least one of a lower surface of the upper base forming sheet and an upper surface of the lower base forming sheet.

5) An expansion tank device described in par. 4) wherein the bottom plate is made of aluminum, and the bottom plate is brazed to the upper base forming sheet utilizing a brazing material layer formed on at least one of a lower surface of the bottom plate and an upper surface of the upper base forming sheet.

6) An expansion tank device described in par. 1) wherein the bulging portion of the tank main body has a flat top wall, and the top wall has a downwardly projecting portion opposed to an opening defined by an upper end of the baffle plate.

7) An expansion tank device described in par. 1) wherein the tank main body and the bottom plate are each made of a metal, and the bulging portion of the tank main body is provided along an outer periphery thereof with an outward flange brazed to the bottom plate.

8) An expansion tank device described in par. 7) wherein the tank main body and the bottom plate are each made of aluminum, and the outward flange of the tank main body is brazed to the bottom plate utilizing a brazing material layer formed on at least one of a lower surface of the tank main body and an upper surface of the bottom plate.

9) A process for fabricating an expansion tank device described in par. 1), the process including the steps of: preparing a lower base forming metal sheet having a downwardly bulging cooling liquid channel and an upper base forming metal sheet having a communication hole formed therethrough, preparing a tank main body of metal including an upwardly bulging portion having an opening at a lower end thereof and a bottom plate of metal for closing the lower-end opening of the bulging portion of the tank main body, forming a through hole in the bottom plate and forming a baffle plate on the bottom plate along the entire circumference of an inner peripheral edge thereof defining the through hole, the baffle plate slanting upwardly toward a central portion of the through hole, superposing the upper base forming sheet on the lower base forming sheet with the communication hole opposed to the cooling liquid channel, placing the bottom plate on the upper base forming sheet with the communication hole included in the through hole and placing the tank main body on the bottom plate with the baffle plate positioned inside the upwardly bulging portion, and brazing the upper and lower base forming sheets to each other, the base plate to the upper base forming sheet and the tank main body to the bottom plate at the same time.

10) A process for fabricating an expansion tank device described in par. 9) which comprises making the upper and lower base forming sheets, the bottom plate and the tank main body from aluminum, forming a brazing material layer on at least one of a lower surface of the upper base forming sheet and an upper surface of the lower base forming sheet, forming a brazing material layer on at least one of a lower surface of the tank main body and an upper surface of the bottom plate, forming a brazing material layer on at least one of a lower surface of the bottom plate and an upper surface of the upper base forming sheet, and brazing the upper and lower base forming sheets to each other, the base plate to the upper base forming sheet and the tank main body to the bottom plate using these brazing material layers.

11) A liquid cooling radiator comprising a cooling liquid circulating channel connected to opposite-end openings of the cooling liquid channel in the tank installation base of the expansion tank device described in par. 1), a heat receiving unit provided at an intermediate portion of the circulating channel, and a pump for circulating a cooling liquid through the cooling liquid channel of the tank installation base and the circulating channel.

12) A liquid cooling radiator described in par. 11) wherein the cooling liquid is enclosed in the cooling liquid channel and the circulating channel in an amount permitting the cooling liquid to fill the cooling liquid channel and the circulating channel, with the liquid level inside the bulging portion of the expansion tank positioned above an opening defined by an upper end of the baffle plate on the tank bottom plate, when the expansion tank device is in a vertical position, the amount of the cooling liquid further permitting the cooling liquid to fill the cooling liquid channel and the circulating channel, with the liquid level inside the bulging portion of the expansion tank positioned above the opening defined by the baffle plate upper end, when the expansion tank device is turned upside down.

13) A liquid cooling radiator described in par. 11) wherein the heat receiving unit comprises a heat receiving unit main body made from two highly heat-conductive sheets joined as superposed on each other and provided with a cooling liquid channel having opposite-end openings between the two heat-conductive sheets, and a heat transfer member made from a highly heat-conductive material and provided inside the cooling liquid channel of the unit main body, the unit main body having an outer surface providing a heat receiving portion thermally in contact with a heat generating body.

14) A liquid cooling radiator described in par. 13) wherein the heat transfer member comprises a flat tube having a plurality of borelike passageways formed in parallel and extending longitudinally of the cooling liquid channel of the unit main body.

15) A liquid cooling radiator described in par. 14) wherein the two heat-conductive sheets and the flat tube are each made of aluminum, and the two heat-conductive sheets are brazed to each other, the flat tube being brazed to the two heat-conductive sheets.

16) A liquid cooling radiator described in par. 15) wherein the flat tube is brazed except at opposite end portions thereof to the two heat-conductive sheets.

17) A liquid cooling radiator described in par. 16) wherein the two heat-conductive sheets and the flat tube are each made of a bare aluminum material, and the flat tube is brazed to the two heat-conductive sheets with a sheet of brazing material.

18) A liquid cooling radiator described in par. 16) wherein one of the two heat-conductive sheets comprises an aluminum brazing sheet having a brazing material layer on an inner surface thereof, and the other heat-conductive sheet and the flat tube each comprise a bare aluminum material, said one heat-conductive sheet having two portions including respective opposite ends of the flat tube and bulged outward over a length not smaller than the entire width of the flat tube, each of said opposite ends of the flat tube being positioned at a widthwise intermediate part of the corresponding bulged portion of said one heat-conductive sheet, the flat tube being brazed to said one heat-conductive sheet with the brazing material layer of the aluminum brazing sheet, the flat tube being brazed to said other heat-conductive sheet with a sheet of brazing material.

19) A liquid cooling radiator described in par. 16) wherein each of the two heat-conductive sheets comprises an aluminum brazing sheet having a brazing material layer on an inner surface thereof, and the flat tube comprises a bare aluminum material, each heat-conductive sheet having two portions including respective opposite ends of the flat tube and bulged outward over a length not smaller than the entire width of the flat tube, each of said opposite ends of the flat tube being positioned at a widthwise intermediate part of the corresponding bulged portion of each heat-conductive sheet, the flat tube being brazed to each heat-conductive sheet with the brazing material layer of the aluminum brazing sheet.

20) A liquid cooling radiator described in par. 13) wherein the heat transfer member comprises a corrugated fin having crest portions and furrow portions which extend longitudinally of the cooling liquid channel of the unit main body, and connecting portions interconnecting the crest portions and the furrow portions respectively.

21) A liquid cooling radiator described in par. 20) wherein the two heat-conductive sheets and the fin are each made of aluminum, and the two heat-conductive sheets are brazed to each other, the fin having its crest portions and furrow portions brazed to the respective heat-conductive sheets.

22) A liquid cooling radiator comprising a base plate composed of two metal sheets joined as superposed on each other and provided with a heat receiving unit having a cooling liquid channel, an expansion tank device described in par. 1) and a cooling liquid circulating channel connecting the channel of the heat receiving unit to the channel of the expansion tank device, the tank installation base of the expansion tank device comprising the two metal sheets.

23) A liquid cooling radiator described in par. 22) wherein one of the two metal sheets has a through hole exposed to outside for preventing the circulating channel from short-circuiting.

24) A liquid cooling radiator described in par. 22) wherein the heat receiving unit comprises a heat receiving unit main body made from the two metal sheets and provided with a cooling liquid channel having opposite-end openings between the two metal sheets, and a heat transfer member made from a highly heat-conductive material and provided inside the cooling liquid channel of the unit main body, the unit main body having an outer surface providing a heat receiving portion thermally in contact with a heat generating body.

25) A liquid cooling radiator described in par. 24) wherein the heat transfer member comprises a flat tube having a plurality of borelike passageways formed in parallel and extending longitudinally of the cooling liquid channel of the unit main body.

26) A liquid cooling radiator described in par. 25) wherein the two metal sheets and the flat tube are each made of aluminum, and the two metal sheets are brazed to each other, the flat tube being brazed to the two metal sheets.

27) A liquid cooling radiator described in par. 26) wherein the flat tube is brazed except at opposite end portions thereof to the two metal sheets.

28) A liquid cooling radiator described in par. 27) wherein the two metal sheets and the flat tube are each made of a bare aluminum material, and the flat tube is brazed to the two metal sheets with a sheet of brazing material.

29) A liquid cooling radiator described in par. 27) wherein one of the metal sheets comprises an aluminum brazing sheet having a brazing material layer on an inner surface thereof, and the other metal sheet and the flat tube each comprise a bare aluminum material, said one metal sheet having two portions including respective opposite ends of the flat tube and bulged outward over a length not smaller than the entire width of the flat tube, each of said opposite ends of the flat tube being positioned at a widthwise intermediate part of the corresponding bulged portion of said one metal sheet, the flat tube being brazed to said one metal sheet with the brazing material layer of the aluminum brazing sheet, the flat tube being brazed to said other metal sheet with a sheet of brazing material.

30) A liquid cooling radiator described in par. 27) wherein each of the two metal sheets comprises an aluminum brazing sheet having a brazing material layer on an inner surface thereof, and the flat tube comprises a bare aluminum material, each metal sheet having two portions including respective opposite ends of the flat tube and bulged outward over a length not smaller than the entire width of the flat tube, each of said opposite ends of the flat tube being positioned at a widthwise intermediate part of the corresponding bulged portion of each metal sheet, the flat tube being brazed to each metal sheet with the brazing material layer of the aluminum brazing sheet.

31) A liquid cooling radiator described in par. 24) wherein the heat transfer member comprises a corrugated fin having crest portions and furrow portions which extend longitudinally of the cooling liquid channel of the unit main body, and connecting portions interconnecting the crest portions and the furrow portions respectively.

32) A liquid cooling radiator described in par. 31) wherein the two metal sheets and the fin are each made of aluminum, and the two metal sheets are brazed to each other, the fin having its crest portions and furrow portions brazed to the respective metal sheets.

33) A notebook personal computer comprising a main body having a keyboard, and a display unit openably attached to the main body, the main body including a housing having disposed therein a liquid cooling radiator described in any one of par. 11) to 32).

When the expansion tank device described in par. 1) is provided with a cooling liquid circulating channel as connected to opposite-end openings of the cooling liquid channel of the tank installation base, a heat receiving unit disposed at an intermediate portion of the circulating channel, and a pump for circulating a cooling liquid through the cooling liquid channel of the installation base and the circulating channel, the cooling liquid heated by the heat receiving unit with the heat emitted by a heat generating source is cooled while being returned to the heat receiving unit by the pump via the circulating channel and the channel of the installation base. The air contained in the form of bubbles in the cooling liquid enters the bulging portion of the tank main body through the communication hole of the installation base and the through hole of the bottom plate while passing through the cooling liquid channel of the base, and is collected in the bulging portion. The air entering the bulging portion once encounters difficulty in reversely flowing into the cooling liquid channel owing to the function of the baffle plate provided around the through hole. Accordingly, the air is removed from the cooling liquid inside the circulating channel to ensure an improved cooling efficiency. Even if the cooling liquid thermally expands by being heated with the heat received from the heat generating source, the liquid flows into the bulging portion. This prevents the cooling liquid circulating channel from breaking owing to an increase in the internal pressure. Further if an excess of cooling liquid is placed in the tank main body of the expansion tank device, the impairment of cooling efficiency is avoidable even when the amount of cooling liquid decreases.

With the expansion tank device described in par. 2) to 4), the upper and lower base forming sheets can be made by a simple method to provide the tank installation base easily.

The expansion tank device described in par. 5) can be made relatively easily in its entirety.

The expansion tank device described in par. 6) makes it difficult for the air ingressing into the bulging portion of the tank body to reversely flow into the cooling liquid channel of the tank installation base.

In the case of the expansion tank device described in par. 7) and 8), the tank main body and the bottom plate can be made by a simple method, consequently providing the expansion tank relatively easily.

The expansion tank device can be made relatively easily in its entirety by the process described in par. 9) and 10) for fabricating the device.

With the liquid cooling radiator described in par. 11) and 12), the cooling liquid heated in the heat receiving unit with the heat emitted by the heat generating source is cooled while being returned to the unit by the pump through the circulating channel and the channel of the tank installation base. The air contained in the form of bubbles in the cooling liquid enters the bulging portion of the tank main body through the communication hole of the installation base and the through hole of the bottom plate while passing through the cooling liquid channel of the base, and is collected in the bulging portion. The air entering the bulging portion once encounters difficulty in reversely flowing into the cooling liquid channel owing to the function of the baffle plate provided around the through hole. Accordingly, the air is removed from the cooling liquid inside the circulating channel to ensure an improved cooling efficiency. Even if the cooling liquid thermally expands by being heated with the heat received from the heat generating source, the liquid flows into the bulging portion. This prevents the cooling liquid circulating channel from breaking owing to an increase in the internal pressure. Further if an excess of cooling liquid is placed in the tank main body of the expansion tank device, the impairment of cooling efficiency is avoidable even when the amount of cooling liquid decreases.

With liquid cooling radiator described in par. 12), the air inside the bulging portion of the expansion tank is prevented from reversely flowing into the cooling liquid channel to the greatest possible extent no matter what posture the tank device assumes.

With the liquid cooling radiator described in par. 13), the heat emitted by the heat generating body thermally in contact with the heat receiving portion is transferred from the highly heat-conductive sheet directly to the cooling liquid flowing through the cooling liquid channel and also to the cooling liquid flowing through the cooling liquid channel via the highly heat-conducive sheet and the heat transfer member. This ensures the transfer of heat from the heat generating body to the cooling liquid with an improved efficiency.

With the liquid cooling radiator described in par. 14), the cooling liquid flowing into the fluid channel of the heat receiving unit main body dividedly flows through the borelike passageways of the flat tube and is consequently given an increased area of heat transfer while being given an increased flow velocity when flowing through the passageways of the flat tube. Accordingly, the heat from the heat generating body thermally in contact with the heat receiving portion of the unit main body is transferred to the cooling liquid by convection with a higher heat transfer coefficient.

With the liquid cooling radiator described in par. 15), the flat tube is brazed to the highly heat-conductive sheets. This gives an enhanced fracture strength to the cooling liquid channel of the unit main body against the internal pressure.

With the liquid cooling radiator described in par. 16), the flat tube is brazed to the two heat-conductive sheets while the melt of brazing material is being prevented from flowing into the tube passageways, whereby the passageways are prevented from becoming clogged.

In the case of the liquid cooling radiator described in par. 18) and 19), the flat tube is brazed to the two heat-conductive sheets, with the melt of brazing material prevented from flowing into the tube passageways. This prevents the passageways from becoming clogged.

With the liquid cooling radiator described in par. 20), the cooling liquid flowing into the fluid channel of the unit main body dividedly flows through passageways defined by respective adjacent pairs of connecting portions of the fin. As a result, the liquid is given an increased area of heat transfer and further given an increased flow velocity when flowing through the passageways. The heat from the heat generating body thermally in contact with the heat receiving portion of the unit main body is therefore transferred to the cooling liquid by convection with a higher heat transfer coefficient.

With the liquid cooling radiator described in par. 21), the crest portions and the furrow portions of the fin are brazed to the respective heat-conductive sheets, so that the cooling liquid channel of the unit main body is enhanced in fracture strength against the internal pressure.

For example, a helium leak test is conducted after the metal sheets are joined in fabricating the liquid cooling radiator described in par. 23). If the metal sheets has therebetween a faulty joint that will not allow the circulating channel to communicate with an outer peripheral portion of the base plate but that would short-circuit the circulating channel, a leak of helium to the outside via the short-circuit preventing through hole will be detected, thus indicating the occurrence of the faulty joint. This serves to preclude the impairment of heat dissipation performance attributable to the short-circuiting of the cooling liquid circulating channel. If the metal sheets has therebetween a faulty joint that will not allow the circulating channel to communicate with an outer peripheral portion of the base plate but that would short-circuit the circulating channel in the absence of the short-circuit preventing through hole, a leak of helium is not detectable even if the helium leak test is conducted. If occurring, such a fault will cause short-circuiting of the circulating channel, rendering the cooling liquid unable to flow through the entire circulating channel and entailing the likelihood of impaired heat dissipation performance. The short-circuit preventing through hole formed in either one of the metal sheets further serves to give reduced weight to the base plate.

The liquid cooling radiator described in par. 24) to 27) has the same advantages as the radiator described in par. 13) to 16).

The liquid cooling radiator described in par. 29) and 30) has the same advantage as the radiator described in par. 18) and 19).

The liquid cooling radiator described in par. 31) and 32) has the same advantages as the radiator described in par. 20) and 21).

With the notebook personal computer described in par. 33), the CPU or like heat generating electronic component can be cooled efficiently, while the radiator ensures the reduction of noise.

BEST MODE OF CARRYING OUT THE INVENTION

Embodiment of the present invention will be described below with reference to the drawings. In the following description, the direction indicated by the arrow X in FIG. 1 will be referred to as "left," the opposite direction as "right, the direction indicated by the arrow Y in the same drawing as "front," and the opposite direction as "rear."

Figure 1:
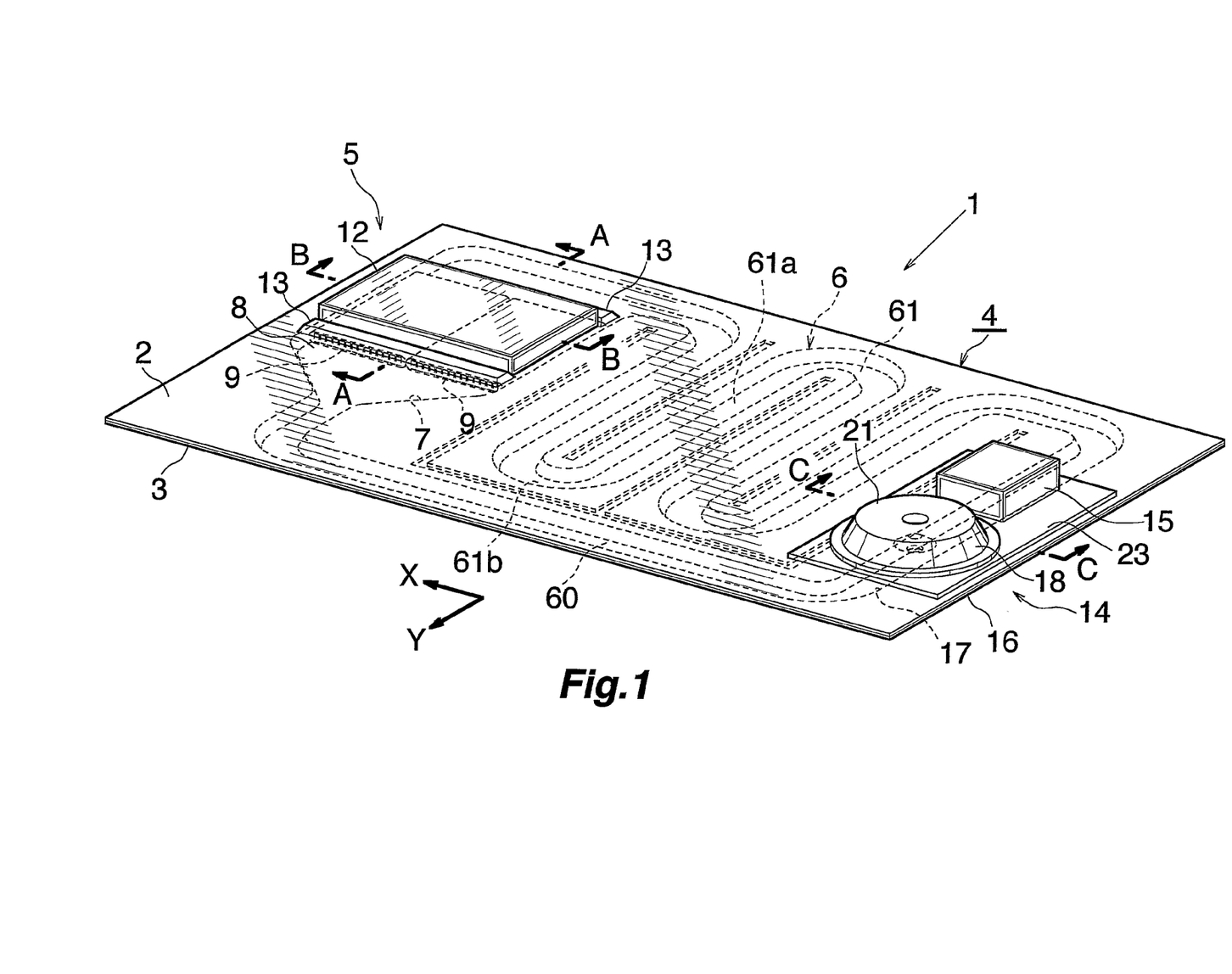
FIG. 1 is a perspective view showing the overall construction of a liquid cooling radiator comprising a heat receiving unit and embodying the invention.
Figure 2:
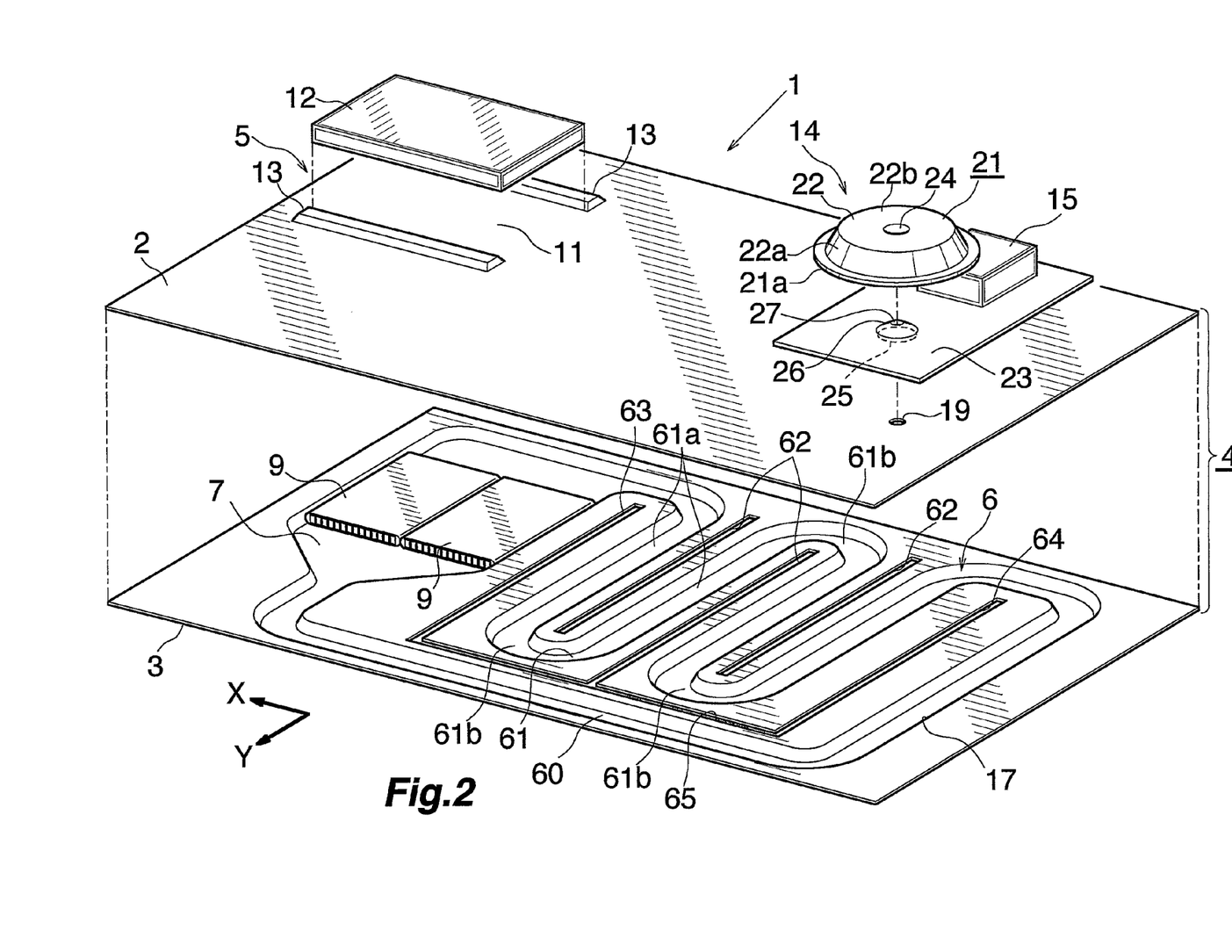
FIG. 2 is an exploded perspective view showing the overall construction of the liquid cooling radiator of the invention.
Figure 8:
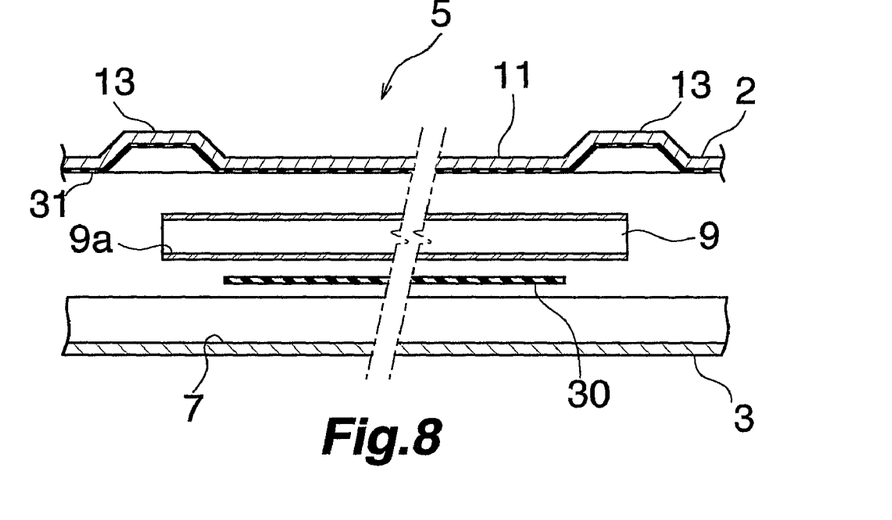
FIG. 8 is a sectional view of a heat receiving unit to show a process for fabricating the radiator.
Figure 9:
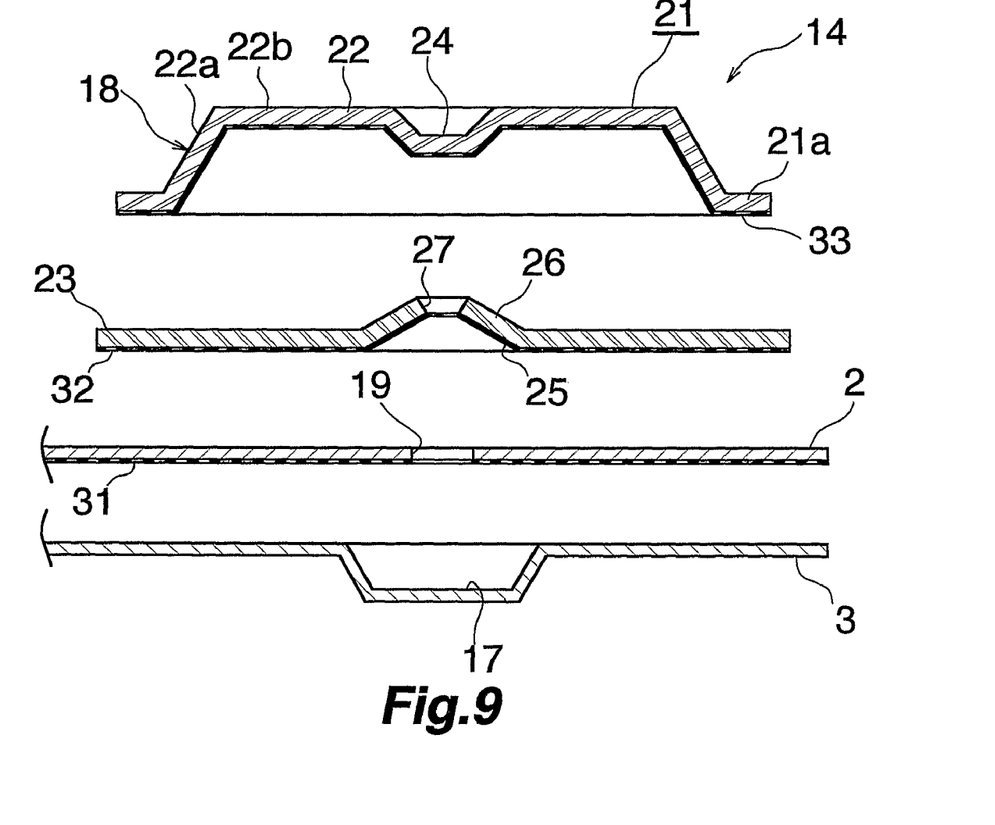
FIG. 9 is a sectional view of an expansion tank device to show the process for fabricating the radiator.

FIGS. 1 and 2 show the overall construction of a liquid cooling radiator having an expansion tank device and embodying the present invention, and FIGS. 3 to 7 show the constructions of main portions thereof. FIGS. 8 and 9 show a process for fabricating the radiator.

With reference to FIGS. 1 and 2, the liquid cooling radiator 1 has a base plate 4 in the form of a leftwardly or rightwardly elongated rectangle and composed of upper and lower two highly heat-conductive sheets, e.g., aluminum sheets 2, 3, which are joined as superposed on each other. The base plate 4 is integrally provided with a heat receiving unit 5 having a cooling liquid channel 7, an expansion tank device 14 having a cooling liquid channel 17, and a cooling liquid circulating channel 6 interconnecting the two channels 7, 17. The cooling liquid channels 7, 17 and the circulating channel 6 have enclosed therein a cooling liquid not corrosive to aluminum and comprising an antifreeze solution.

The upper aluminum sheet 2 is made of an aluminum brazing sheet having a brazing material layer over the lower surface thereof. The lower aluminum sheet 3 is made of a bare aluminum material. The aluminum sheets 2, 3 are brazed to each other utilizing the brazing material layer of the upper aluminum sheet 2.

Figure 3:
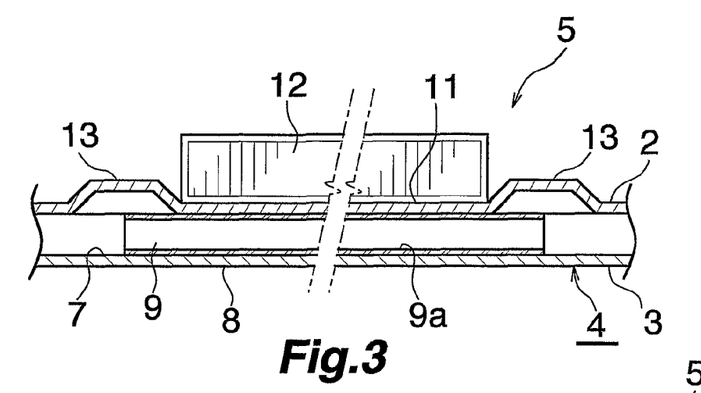
FIG. 3 is an enlarged view in section taken along the line A-A in FIG. 1.
Figure 4:
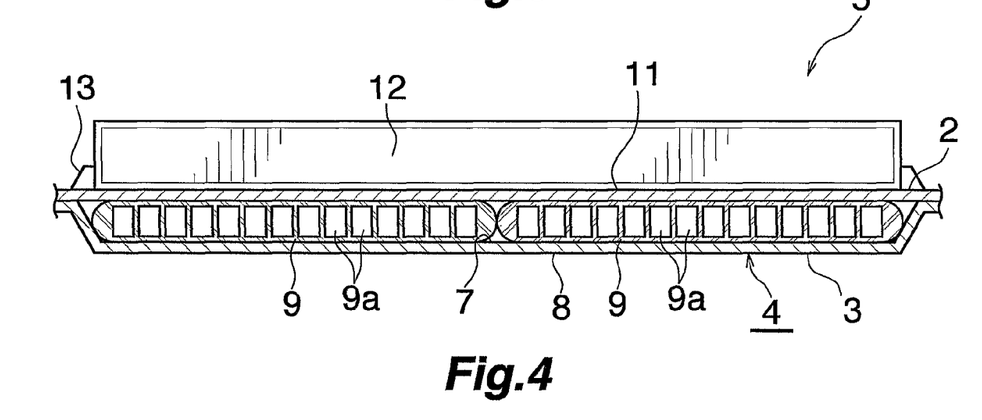
FIG. 4 is an enlarged view in section taken along the line B-B in FIG. 1.

As shown in greater detail in FIGS. 3 and 4, the heat receiving unit 5 comprises a heat receiving unit main body 8 made from the upper and lower aluminum sheets 2, 3 and having the cooling liquid channel 7 formed between and defined by the two aluminum sheets 2, 3 and extending in the front-rear direction, and two flat aluminum tubes 9 arranged side by side in the left-right direction within the channel 7 of the unit main body 8, made of a highly heat-conductive material, e.g., aluminum extrudates, and serving as heat transfer members.

The upper aluminum sheet 2 constituting the unit main body 8 has an upper surface providing a heat receiving portion 11 thermally in contact with a heat generating body 12. The cooling liquid channel 7 of the unit main body 8 is formed by bulging the lower aluminum plate 3 downward, and has a front end portion gradually decreasing in width toward the front end. The channel 7 has a front-end opening and a right-end opening at the rear end thereof. The upper aluminum sheet 2 forming the unit main body 8 has portions including opposite ends of the flat tubes 9 and bulged outward over a length not smaller than the sum of the entire widths of the two flat tubes 9 to provide bulged portions 13 extending in the left-right direction for preventing the inflow of brazing material.

Each of the flat tubes 9 has borelike passageways 9a formed in parallel and extending longitudinally of the channel 7 (in the front-rear direction). Each end of the flat tube 9 is positioned at a widthwise intermediate part (with respect to the front-rear direction) of the corresponding bulged portion 13. The upper wall of the flat tube 9 is brazed, over the entire portion thereof in contact with the lower surface of the upper aluminum sheet 2, to the sheet 2 utilizing the brazing material layer on the lower surface of the upper aluminum sheet 2. The lower wall of the flat tube 9 is brazed except at opposite end portions thereof to the lower aluminum sheet 3 utilizing a sheet of brazing material shorter than the tube 9. All the passageways 9a of the flat tube 9 except for those at opposite ends of the tube are preferably 0.5 to 2.0 mm in height, and preferably 0.3 to 1.5 mm in left-to-right width. The upper and lower walls of the tube 9 are preferably 0.2 to 1.0 mm in thickness, and the partition wall between each adjacent pair of passageways 9a is preferably 0.1 to 0.5 mm in thickness. For example, the passageway 9a is 1.1 mm in height and 0.55 mm in left-to-right width, the upper and lower walls of the tube 9 are 0.3 mm in thickness, and the partition wall between each adjacent pair of passageways 9a is 0.2 mm in thickness.

In place of the flat tube of aluminum extrudate, an electric resistance welded tube of aluminum may be used which has a plurality of borelike passageways formed therein by inserting inner fins into the tube. Also usable is a tube which is made from a plate prepared from an aluminum brazing sheet having an aluminum brazing material layer on one side thereof by rolling work and which comprises two flat wall forming portions joined by a connecting portion, a side wall forming portion formed on each flat wall forming portion integrally therewith and projecting from one side edge thereof opposite to the connecting portion, and a plurality of partition forming portions projecting from each flat wall forming portion integrally therewith and arranged at a spacing widthwise thereof, by bending the plate to the shape of a hairpin at the connecting portion and brazing the side wall forming portions to each other in butting relation to form partition walls by the partition forming portions and form borelike passageways. In this case, the side wall forming portions and the partition forming portions are formed on the side of the brazing sheet having the brazing material.

The expansion tank device 14 is provided on a right end portion of the base plate 4. Provided in the rear of the tank device 14 is a pump 15 for circulating the cooling liquid through the channel 7 of the heat receiving unit 5, the circulating channel 6 and the channel 17 of the expansion tank device 14.

Figure 5:
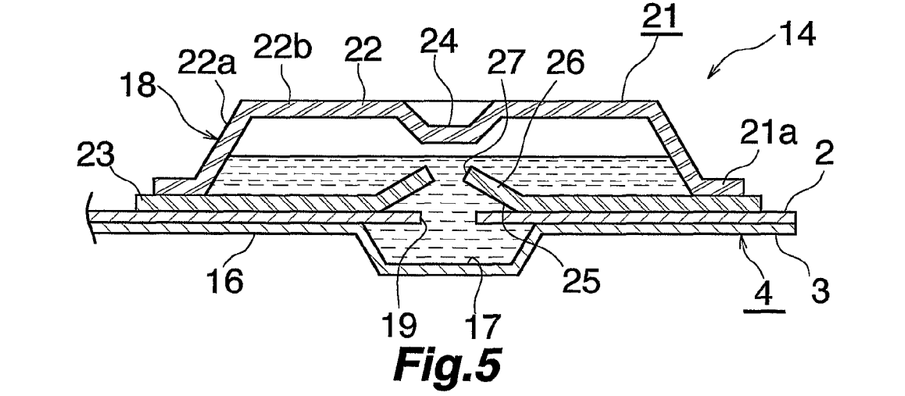
FIG. 5 is an enlarged view in section taken along the line C-C in FIG. 1.

As shown in detail in FIG. 5, the expansion tank device 14 is made from the upper and lower aluminum sheets 2, 3 (upper and lower two base forming sheets), and has a tank installation base 16 provided with the cooling liquid channel 17 defined by the aluminum sheets 2, 3 therebetween and extending in the front-rear direction, and an expansion tank 18 mounted on the base 16.

The channel 17 of the tank installation base 16 is formed by bulging the lower aluminum sheet 3 downward. The upper aluminum sheet 2 providing the tank installation base 16 has a circular communication hole 19 for causing the channel 17 to communicate with the space above the base 16. The hole 19 is not limited to circular in shape.

The expansion tank 18 comprises an aluminum tank main body 21 including an upwardly bulging portion 22 having an opening at the lower end thereof, and an aluminum bottom plate 23 closing the lower-end opening of the tank main body 21 and extending rearward beyond the main body 21.

The tank main body 21 is made from a disk of aluminum brazing sheet having a brazing material layer over the lower surface thereof by upwardly bulging the portion of the disk other than a peripheral edge portion thereof. The bulging portion 22 is frustoconical and has a peripheral wall 22a slanting radially inwardly upward. The bulging portion 22 has a flat top wall 22b provided with a downward projection 24 at its center. The bulging portion 22 of the tank main body 21 is provided along its outer periphery with an outward flange 21a brazed to the bottom plate 23 utilizing the brazing material layer so that the downward projection 24 is positioned immediately above the communication hole 19. The tank main body 21 is not limited only to one made from a disk, nor is the bulging portion 22 limited to the frustoconical shape.

The bottom plate 23 is a rectangular plate elongated in the front-rear direction and made of an aluminum brazing sheet having a brazing material layer on its lower side, and is brazed to the upper aluminum sheet 2 of the base 16 utilizing the brazing material layer. The bottom plate 23 is provided, at the portion thereof corresponding to the communication hole 19 of the upper aluminum sheet 2, with a circular through hole 25 larger than the hole 19 and concentric with the hole 19 so as to communicate therewith. The through hole 25 is not limited only to the circular shape. The inner peripheral edge of the bottom plate 23 defining the through hole 25 is integrally provided with a baffle plate 26 formed over the entire circumference thereto and slanting radially inwardly upward defining an opening 27 by the upper end thereof. The downward projection 24 is opposed to the opening 27.

The pump 15 is mounted on the bottom plate 23 of the tank device 14 at the portion thereof projecting rearward beyond the tank main body 21.

The cooling liquid circulating channel 6 of the radiator 1 is formed by downwardly bulging the lower aluminum sheet 3. The channel 6 is formed between the leftward extensions of the upper and lower aluminum sheets 2, 3 providing the tank installation base 16 and between the rightward extensions of the upper and lower aluminum sheets 2, 3 providing the unit main body 8. The circulating channel 6 comprises a straight first portion 60 for causing the front-end opening of the cooling liquid channel 7 of the heat receiving unit 5 to communicate with a front-end opening of the cooling liquid channel 7 of the expansion tank device 14 therethrough, and a zigzag second portion 61 for causing the right-end opening of the channel 7 at its rear end to communicate with a rear-end opening of the channel 17 therethrough. The second portion 61 has a plurality of straight parts 61a extending in the front-rear direction and bent parts 61b interconnecting respective adjacent pairs of straight parts 61a alternately at the front and rear. First to third short-circuit preventing slits (through holes) 62, 63, 64 extending in the front-rear direction for detecting leaks from the circulating channel 6 are formed in the lower aluminum sheet 3 between respective adjacent pairs of straight parts 61a, 61a of the second portion 61, between the channel 7 of the unit 5 and the left-end straight part 61a, and between the right-end straight part 61a and the channel 17 of the tank device 14. A fourth short-circuit preventing slit (through hole) 65 extending in the left-right direction for preventing leaks from the channel 6 is formed in the lower aluminum sheet 3 between the first portion 60 and the front bent parts 61b of the second portion 61. The first slit 62 formed between the two straight parts 61a connected together by the bent part 61b at a right end portion, the second slit 63 and the third slit 64 communicate with the fourth slit 65.

Figure 6:
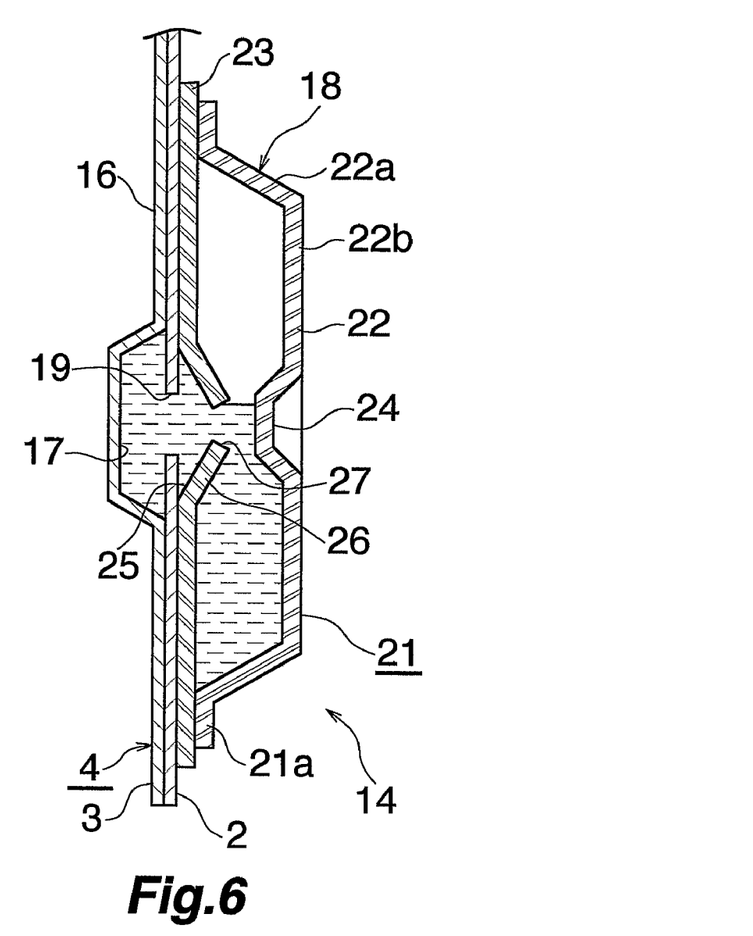
FIG. 6 is a sectional view corresponding to FIG. 5 with a base in a vertical position.
Figure 7:
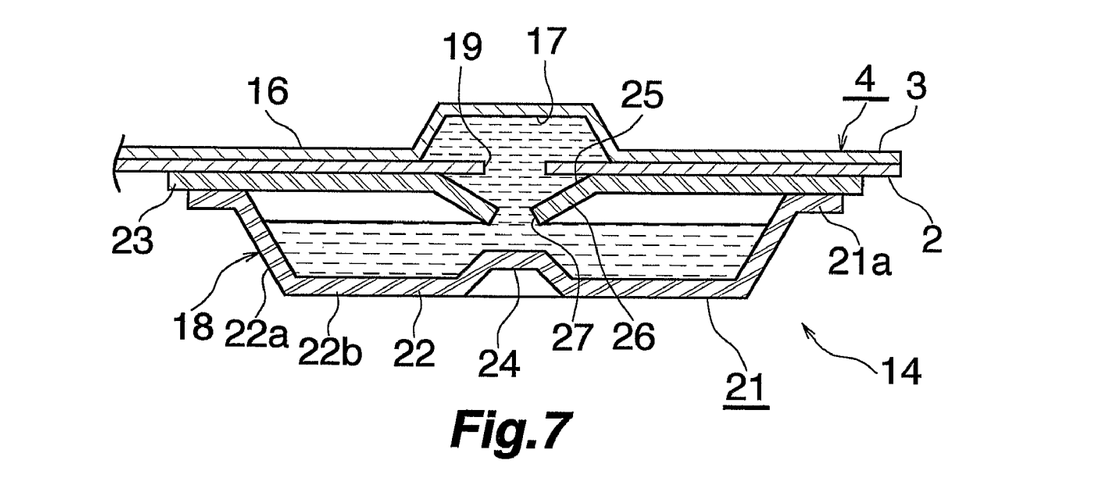
FIG. 7 is a sectional view corresponding to FIG. 5 with the base turned upside down.

The cooling liquid is enclosed in the channel 7 of the heat receiving unit 5, the channel 17 of the expansion tank device 14 and the circulating channel 6 in such an amount that when the base plate 4 is in a vertical position as shown in FIG. 6, the liquid fills the channels 7, 17 and the circulating channel 6, with the liquid level inside the bulging portion 22 of the expansion tank 8 positioned above the upper-end opening 27 of the baffle plate 26 of the tank bottom plate 23, the amount of the cooling liquid further being such that when the base plate 4 is turned upside down as shown in FIG. 7, the liquid fills the channels 7, 17 and the circulating channel 6, with the liquid level inside the bulging portion 22 of the expansion tank 18 positioned above the upper-end opening 27 of the baffle plate 26 of the tank bottom plate 23.

The liquid cooling radiator 1 described above is used, for example, in a notebook personal computer comprising a computer main body having a keyboard and a display unit openably attached to the main body, with the CPU (heat generating source) positioned thermally in contact with the heat receiving portion 11 of heat receiving unit 5 of the radiator 1. When the personal computer is started up, the cooling liquid is circulated through the channel 7 of the heat receiving unit 5, the channel 17 of the expansion tank device 14 and the circulating channel 6 by the pump 15. The heat emitted by the CPU is transferred to the cooling liquid flowing through the bore-like passageways 9a in the flat tubes 9 inside the channel 7 of the heat receiving unit 5 through the upper aluminum sheet 2. While the cooling liquid flows through the circulating channel 6 and the channel 17 of the expansion tank device 14 and returns to the channel 7 of the unit 5, heat absorbed by the liquid is released to the outside through the upper and lower aluminum sheets 2, 3 to cool the liquid. This mode of operation is repeated to dissipate the heat emitted by the CPU.

If a large quantity of heat is emitted by the CPU, a radiator (not shown) having radiant fins may be provided on a portion of the base plate 4 away from the heat receiving unit 5, with a current of air applied to the radiant fins of the radiator by a silent cooling fan (not shown) of a smaller output than is conventionally used.

While passing through the cooling liquid channel 17 of the expansion tank device 14, the air contained in the form of bubbles in the cooling liquid flows through the hole 19 in the tank installation base 16 and the hole 25 in the bottom plate 23 into the bulging portion 22 of the tank main body 21 and collected therein. The air entering the bulging portion 22 once encounters difficulty in reversely flowing into the channel 17 by virtue of the function of the baffle plate 26 around the through hole 25. Accordingly, air is removed from the cooling liquid inside the circulating channel 6 for an improved cooling efficiency. Even if the cooling liquid is heated with the heat received from the CPU and thermally expanded, the cooling liquid flows into the tank main body 21 of the expansion tank 18, whereby the circulating channel is prevented from breaking owing to the increase of internal pressure. When an excess of cooling liquid is placed into the bulging portion 22 of tank main body 21 of the expansion tank device 14, the impairment of cooling efficiency is avoidable even if the amount of cooling liquid decreases.

The liquid cooling radiator described above is fabricated by the process to be described below with reference to FIGS. 8 and 9.

Bulged portions 13 of a heat receiving unit 5 for preventing inflow of brazing material and a communication hole 19 of an expansion tank device 14 are formed at the same time in an upper aluminum sheet 2 in the form of an aluminum brazing sheet having a brazing material layer 31 over the lower surface thereof by press work. By press work, a cooling liquid channel 7 of the heat receiving unit 5, cooling liquid channel 17 of the expansion tank device 14 and cooling liquid circulating channel 6 are formed at the same time by downwardly bulging a lower aluminum sheet 3 of bare aluminum material, and first to fourth slits 62, 63, 64 are also formed in the lower sheet. A bulging portion 22 and a downward projection 24 are formed at the same time by press work in a disk of aluminum brazing sheet having a brazing material layer 33 over its lower surface to make a tank main body 21. A bottom plate 23 of aluminum brazing sheet having a brazing material layer 32 over the lower surface thereof is also subjected to press work to form a through hole 25, baffle plate 26 and opening 27.

Two flat tubes 9 of aluminum extrudates are then arranged side by side in the left-right direction inside the channel 7 of the heat receiving unit 5. Provided between the inner surface of the downwardly bulged portion forming the channel 7 and the bottom surfaces of the tubes 9 at this time is a sheet of brazing material 30 shorter than the flat tubes 9 and having opposite ends positioned inwardly of respective opposite ends of the flat tubes 9 with respect to the lengthwise direction thereof.

The upper and lower aluminum sheets 2, 3 are thereafter superposed on each other, and the bottom plate 23 and the tank main body 21 are arranged on the upper sheet 2. The aluminum sheets 2, 3 are brazed to each other, the sheets 2, 3 are brazed to the flat tubes 9, the upper sheet 2 is brazed to the bottom plate 23, and the bottom plate 23 is brazed to the tank main body 21 simultaneously. These components are brazed by utilizing the brazing material layer 31 of the upper aluminum sheet 3, the sheet of brazing material 30, the brazing material layer 32 of the bottom plate 23 and the brazing material layer 33 of the tank main body 21. In this way, the liquid cooling radiator 1 is fabricated.

The radiator 1 thus made is subjected to a helium leak test. If the joint between two metal sheets 2, 3 has a fault allowing the circulating channel 6 to communicate with an outer peripheral portion of the base plate 4, a leak of helium from the outer peripheral portion to the outside will be detected.

Further if the radiator has such a faulty joint that will not allow the channel 6 to communicate with an outer peripheral portion of the base plate 4 but that would produce a short-circuit in the circulating channel 6, a leak of helium to the outside through the slit 62, 63, 64 or 65 will be detected.

The bulged portions 13 provided in the upper aluminum sheet 2 and the sheet of brazing material 30 shorter than the flat tubes 9, having opposite ends positioned inwardly of opposite ends of the flat tubes 9 with respect to the lengthwise direction thereof, and used for brazing the tubes 9 to the lower aluminum sheet 3 prevent the brazing material from flowing into the passageways 9a of the flat tubes 9 when melted for brazing in fabricating the radiator 1.

Figure 10:
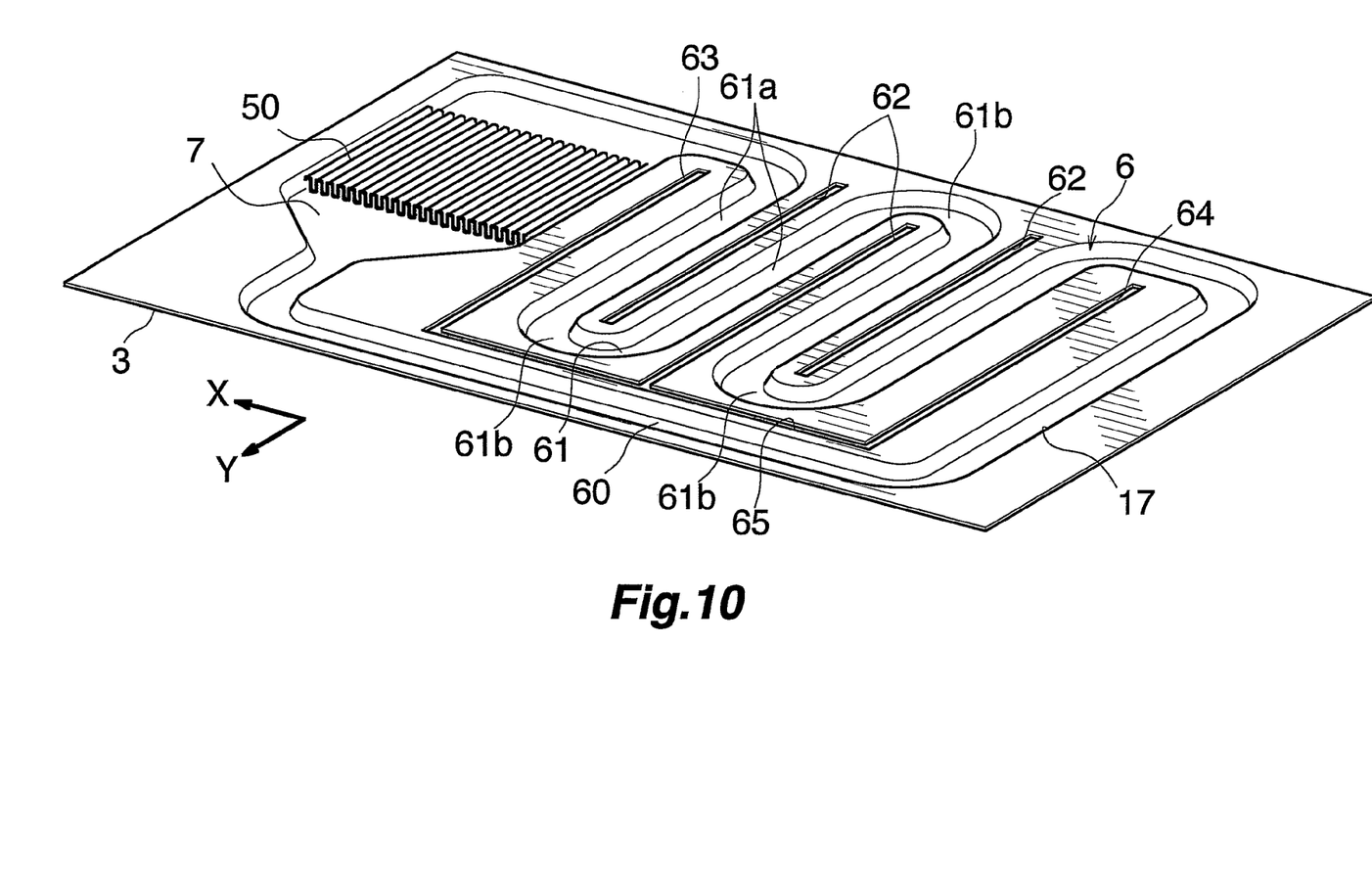
FIG. 10 is a fragmentary perspective view corresponding to a portion of FIG. 2 and showing a modified heat transfer member of the heat receiving unit of the radiator.

FIG. 10 shows a modified heat transfer member 50 of the heat receiving unit.

The heat transfer member 50 shown in FIG. 10 is an aluminum corrugated fin comprising crest portions and furrow portions extending longitudinally of the cooling liquid channel 7 of the heat receiving unit main body 8 and connecting portions interconnecting the crest portions and the furrow portions. The crest portions of the fin are brazed to the upper aluminum sheet 2 utilizing the brazing material layer of the sheet 2, and the furrow portions are brazed to the lower aluminum sheet 3 using a sheet of brazing material. The heat transfer member 50 may be made of an aluminum brazing sheet having a brazing material layer over each of opposite sides thereof and brazed to the two aluminum sheets 2, 3 using the two brazing material layers.

According to the above embodiment, the expansion tank device 14 is provided on the base plate 4 of the radiator 1 integrally therewith along with the heat receiving unit 5 and the cooling liquid circulating channel 6, whereas a liquid cooling radiator may alternatively be provided by making the expansion tank device 14 only separately from the base plate 4, connecting, for example, one end of each of two tubes, separate from the tank device, to the corresponding end of the cooling liquid channel of the tank device, and connecting the other ends of the tubes to the cooling liquid circulating channel 6 on the base plate 4. Further alternatively, a liquid cooling radiator may be provided by making the expansion tank device and the heat receiving unit of the construction described above separately, and connecting the cooling liquid channel of the expansion tank device to the cooling liquid channel of the heat receiving unit, for example, by separate tubes.

Further according to the foregoing embodiment, the bottom plate 23 is brazed to the upper aluminum sheet 2 providing the tank installation base 16 of the expansion tank device 14 utilizing the brazing material layer 32 on the lower surface of the bottom plate 23, whereas a brazing material layer formed on the upper surface of the upper aluminum sheet 2 may alternatively be used for brazing the bottom plate 23 to the upper aluminum sheet 2 without providing the brazing material layer on the lower surface of the bottom plate 23. Although the brazing material layer 33 on the lower surface of the tank main body 21 is used for brazing the outward flange 21a of the tank main body 21 to the bottom plate 23, a brazing material layer may be formed alternatively on the upper surface of the bottom plate 23 for use in brazing the outward flange 21a of the tank main body 21 to the bottom plate 23 without forming the brazing material layer on the lower surface of the tank main body 21.

Figure 11:
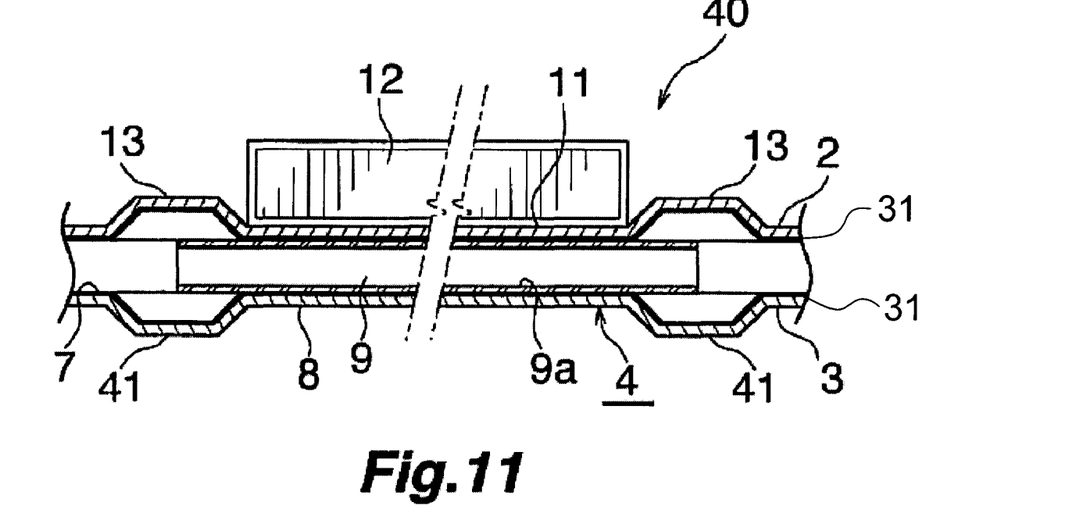
FIG. 11 is a view corresponding to FIG. 3 and showing a modified heat receiving unit.

According to the foregoing embodiment, the upper aluminum sheet 2 is in the form of an aluminum brazing sheet having a brazing material layer on the lower surface thereof, and the lower aluminum sheet 3 is in the form of a bare aluminum material. However, the lower aluminum sheet 3 may also be in the form of an aluminum brazing sheet having a brazing material layer on the upper surface thereof. The lower aluminum sheet 3 forming the heat receiving unit 40 in this case has portions including opposite ends of the flat tubes 9 and bulged outward over a length not smaller than the sum of the entire widths of the two flat tubes 9 as shown in FIG. 11 to provide bulged portions 41 extending in the left-right direction for preventing the inflow of brazing material. The entire portions of the lower walls of the flat tubes 9 which portions are in contact with the lower aluminum sheet 3 are brazed to the sheet 3 utilizing the brazing material layer on the lower sheet 3. Each of opposite ends of the flat tubes 9 is positioned at a widthwise intermediate portion of the corresponding bulged portion 41. When the flat tubes 9 are brazed to the lower aluminum sheet 3 using the brazing material layer on the lower sheet 3, the bulged portions 41 function to prevent the molten brazing material flowing out from the layer on the lower sheet 3 from ingressing into the borelike passageways 9a of the flat tubes 9.

Figure 12:
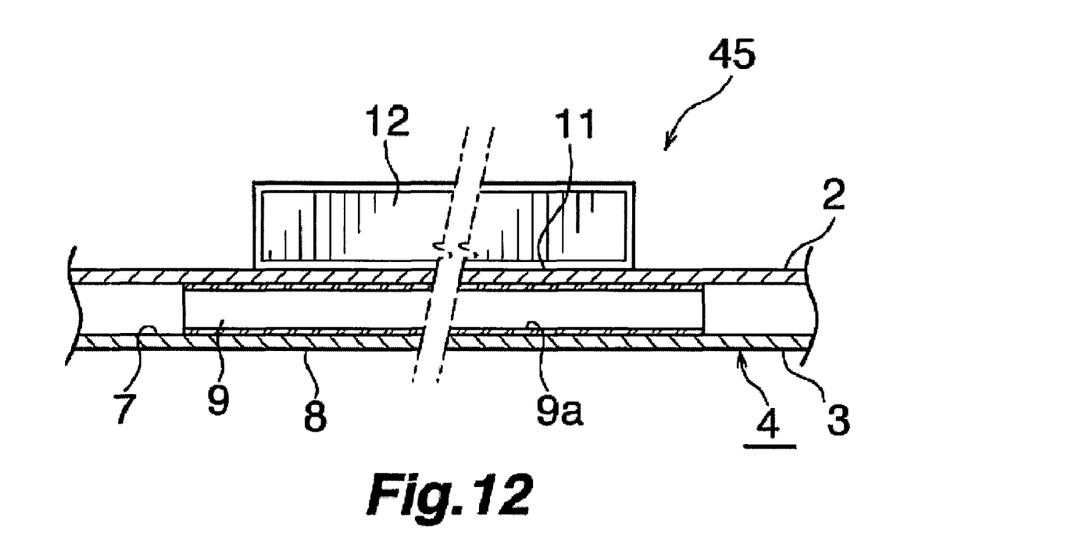
FIG. 12 is a view corresponding to FIG. 3 and showing another modified heat receiving unit.
Figure 13:
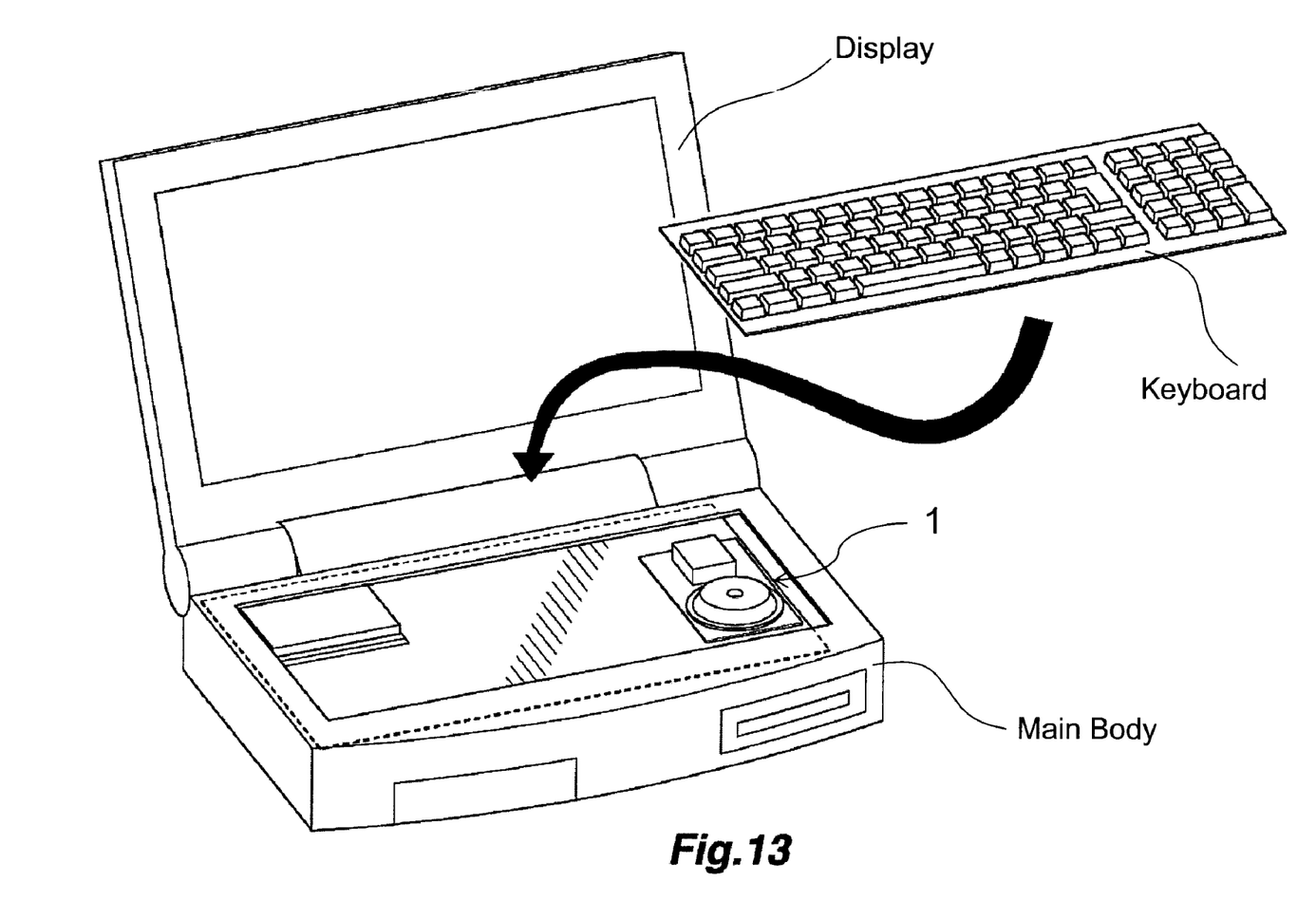

Further according to the foregoing embodiment, the upper aluminum sheet 2 is in the form of an aluminum brazing sheet having a brazing material layer on the lower surface thereof, and the lower aluminum sheet 3 is in the form of a bare aluminum material, whereas each of the two sheets 2, 3 may be in the form of a bare aluminum material. The two aluminum sheets 2, 3 are then brazed using a sheet of brazing material. In this case, the heat receiving unit 45 need not be provided with any bulged portion on the sheets 2, 3 for preventing the inflow of the brazing material as shown in FIG. 12, and the upper walls of the two flat tubes 9 are brazed except at their opposite ends to the upper aluminum sheet 2 with use of a sheet of brazing material shorter than the tubes 9. When the two aluminum sheets 2, 3 are brazed to the flat tubes 9 using the sheet of brazing material, the melt of the brazing material is prevented from flowing into the passageways 9a.

INDUSTRIAL APPLICABILITY

The present invention provides an expansion tank device for use in liquid cooling radiators for dissipating the heat generated by heat sources provided in personal computers, servers and like IT devices, AV devices, industrial machines, tool machines, etc. The device removes the air in the cooling liquid from the circulating system, prevents the circulating system from breaking and precludes the decrease in the amount of cooling liquid within the circulating system.

The invention claimed is:

1. An expansion tank device, comprising:
   a tank installation base having a cooling liquid channel; and
   an expansion tank provided on an upper surface of the installation base,
   wherein the tank installation base has a communication hole for holding space above the upper surface thereof in communication with the cooling liquid channel, the expansion tank has a tank main body including an upwardly bulging portion having an opening at a lower end thereof, and a bottom plate joined to a lower end of the tank main body for closing the lower-end opening of the bulging portion and joined to the upper surface of the tank installation base, the bottom plate of the expansion tank is provided at a portion thereof corresponding to the communication hole with a through hole communicating with the communication hole of the tank installation base, and the bottom plate is provided with a baffle plate formed along the entire circumference of an inner peripheral edge thereof defining the through hole and slanting upwardly toward a central portion of the through hole.

2. An expansion tank device according to claim 1 wherein the tank installation base is made by joining upper and lower two base forming sheets as superposed on each other, and the cooling liquid channel is formed between the upper and lower two base forming sheets by downwardly bulging the lower base forming sheet, the communication hole being formed in the upper base forming sheet.

3. An expansion tank device according to claim 2 wherein the upper and lower two base forming sheets are each made of a metal, and the upper and lower two base forming sheets are joined by brazing.

4. An expansion tank device according to claim 2 wherein the upper and lower two base forming sheets are each made of aluminum, and are brazed with a first brazing material layer formed on at least one of a lower surface of the upper base forming sheet and an upper surface of the lower base forming sheet.

5. An expansion tank device according to claim 4 wherein the bottom plate is made of aluminum, and the bottom plate is brazed to the upper base forming sheet utilizing a second brazing material layer formed on at least one of a lower surface of the bottom plate and an upper surface of the upper base forming sheet.

6. An expansion tank device according to claim 1 wherein the bulging portion of the tank main body has a flat top wall, and the top wall has a downwardly projecting portion opposed to an opening defined by an upper end of the baffle plate.

7. An expansion tank device according to claim 1 wherein the tank main body and the bottom plate are each made of a metal, and the bulging portion of the tank main body is provided along an outer periphery thereof with an outward flange brazed to the bottom plate.

8. An expansion tank device according to claim 7 wherein the tank main body and the bottom plate are each made of aluminum, and the outward flange of the tank main body is brazed to the bottom plate utilizing a brazing material layer formed on at least one of a lower surface of the tank main body and an upper surface of the bottom plate.

9. A process for fabricating the expansion tank device according to claim 1, the process including:
   preparing a lower base forming metal sheet having a downwardly bulging cooling liquid channel and an upper base forming metal sheet having a communication hole formed therethrough;
   preparing the tank main body of metal including the upwardly bulging portion having the opening at the lower end thereof and the bottom plate of metal for closing the lower-end opening of the bulging portion of the tank main body;
   forming the through hole in the bottom plate and forming the baffle plate on the bottom plate along the entire circumference of the inner peripheral edge thereof defining the through hole, the baffle plate slanting upwardly toward the central portion of the through hole;
   superposing the upper base forming sheet on the lower base forming sheet with the communication hole opposed to the cooling liquid channel;
   placing the bottom plate on the upper base forming sheet with the communication hole included in the through hole and placing the tank main body on the bottom plate with the baffle plate positioned inside the upwardly bulging portion; and
   brazing the upper and lower base forming sheets to each other, the base plate to the upper base forming sheet and the tank main body to the bottom plate at the same time.

10. A process for fabricating an expansion tank device according to claim 9 which comprises making the upper and lower base forming sheets, the bottom plate and the tank main body from aluminum, forming a first brazing material layer on at least one of a lower surface of the upper base forming sheet and an upper surface of the lower base forming sheet, forming a second brazing material layer on at least one of a lower surface of the tank main body and an upper surface of the bottom plate, forming a third brazing material layer on at least one of a lower surface of the bottom plate and an upper surface of the upper base forming sheet, and brazing the upper and lower base forming sheets to each other, the base plate to the upper base forming sheet and the tank main body to the bottom plate using the first, second and third brazing material layers.

11. A liquid cooling radiator comprising a cooling liquid circulating channel connected to opposite-end openings of the cooling liquid channel in the tank installation base of the expansion tank device according to claim 1, a heat receiving unit provided at an intermediate portion of the circulating channel, and a pump for circulating a cooling liquid through the cooling liquid channel of the tank installation base and the circulating channel.

12. A liquid cooling radiator according to claim 11 wherein the baffle plate has an upper end defining an opening, and wherein when the expansion tank device is rotated 90 degree to a vertical position, the cooling liquid is enclosed in the cooling liquid channel and the circulating channel in an amount permitting the cooling liquid to fill the cooling liquid channel and the circulating channel, with a liquid level of the cooling liquid inside the bulging portion of the expansion tank above the opening of the baffle plate, and when the expansion tank device is rotated 180 degree to an upside down position, the cooling liquid is enclosed in the cooling liquid channel and the circulating channel in the amount permitting the cooling liquid to fill the cooling liquid channel and the circulating channel with the liquid level inside the bulging portion of the expansion tank above the opening of the baffle plate.

13. A liquid cooling radiator according to claim 11 wherein the heat receiving unit comprises a heat receiving unit main body made from two highly heat-conductive sheets joined as superposed on each other and provided with a second cooling liquid channel having opposite-end openings between the two heat-conductive sheets, and a heat transfer member made from a highly heat-conductive material and provided inside the second cooling liquid channel of the unit main body, the unit main body having an outer surface providing a heat receiving portion thermally in contact with a heat generating body.

14. A liquid cooling radiator according to claim 13 wherein the heat transfer member comprises a flat tube having a plurality of borelike passageways formed in parallel and extending longitudinally of the second cooling liquid channel of the unit main body.

15. A liquid cooling radiator according to claim 14 wherein the two heat-conductive sheets and the flat tube are each made of aluminum, and the two heat-conductive sheets are brazed to each other, the flat tube being brazed to the two heat-conductive sheets.

16. A liquid cooling radiator according to claim 15 wherein the flat tube is brazed except at opposite end portions thereof to the two heat-conductive sheets.

17. A liquid cooling radiator according to claim 16 wherein the two heat-conductive sheets and the flat tube are each made of a bare aluminum material, and the flat tube is brazed to the two heat-conductive sheets with a sheet of brazing material.

18. A liquid cooling radiator according to claim 16 wherein one of the two heat-conductive sheets comprises an aluminum brazing sheet having a brazing material layer on an inner surface thereof, and the other heat-conductive sheet and the flat tube each comprise a bare aluminum material, said one heat-conductive sheet having two portions including respective opposite ends of the flat tube and bulged outward over a length not smaller than the entire width of the flat tube, each of said opposite ends of the flat tube being positioned at a widthwise intermediate part of the corresponding bulged portion of said one heat-conductive sheet, the flat tube being brazed to said one heat-conductive sheet with the brazing material layer of the aluminum brazing sheet, the flat tube being brazed to said other heat-conductive sheet with a sheet of brazing material.

19. A liquid cooling radiator according to claim 16 wherein each of the two heat-conductive sheets comprises an aluminum brazing sheet having a brazing material layer on an inner surface thereof, and the flat tube comprises a bare aluminum material, each heat-conductive sheet having two portions including respective opposite ends of the flat tube and bulged outward over a length not smaller than the entire width of the flat tube, each of said opposite ends of the flat tube being positioned at a widthwise intermediate part of the corresponding bulged portion of each heat-conductive sheet, the flat tube being brazed to each heat-conductive sheet with the brazing material layer of the aluminum brazing sheet.

20. A liquid cooling radiator according to claim 13 wherein the heat transfer member comprises a corrugated fin having crest portions and furrow portions which extend longitudinally of the cooling liquid channel of the unit main body, and connecting portions interconnecting the crest portions and the furrow portions respectively.

21. A liquid cooling radiator according to claim 20 wherein the two heat-conductive sheets and the fin are each made of aluminum, and the two heat-conductive sheets are brazed to each other, the fin having its crest portions and furrow portions brazed to the respective heat-conductive sheets.

22. A liquid cooling radiator, comprising:
a base plate comprising two metal sheets joined as superposed on each other and provided with a heat receiving unit, the heat receiving unit having a cooling liquid channel, the expansion tank device according to claim 1 and a cooling liquid circulating channel connecting the heat receiving unit to the expansion tank device, the tank installation base of the expansion tank device comprising the two metal sheets.

23. A liquid cooling radiator according to claim 22 wherein one of the two metal sheets has a through hole exposed to outside for preventing the circulating channel from short-circuiting.

24. A liquid cooling radiator according to claim 22 wherein the heat receiving unit comprises a heat receiving unit main body made from the two metal sheets and provided with a channel having opposite-end openings between the two metal sheets, and a heat transfer member made from a highly heat-conductive material and provided inside the channel of the unit main body, the unit main body having an outer surface providing a heat receiving portion thermally in contact with a heat generating body.

25. A liquid cooling radiator according to claim 24 wherein the heat transfer member comprises a flat tube having a plurality of borelike passageways formed in parallel and extending longitudinally of the channel of the unit main body.

26. A liquid cooling radiator according to claim 25 wherein the two metal sheets and the flat tube are each made of aluminum, and the two metal sheets are brazed to each other, the flat tube being brazed to the two metal sheets.

27. A liquid cooling radiator according to claim 26 wherein the flat tube is brazed except at opposite end portions thereof to the two metal sheets.

28. A liquid cooling radiator according to claim 27 wherein the two metal sheets and the flat tube are each made of a bare aluminum material, and the flat tube is brazed to the two metal sheets with a sheet of brazing material.

29. A liquid cooling radiator according to claim 27 wherein one of the metal sheets comprises an aluminum brazing sheet having a brazing material layer on an inner surface thereof, and the other metal sheet and the flat tube each comprise a bare aluminum material, said one metal sheet having two portions including respective opposite ends of the flat tube and bulged outward over a length not smaller than the entire width of the flat tube, each of said opposite ends of the flat tube being positioned at a widthwise intermediate part of the corresponding bulged portion of said one metal sheet, the flat tube being brazed to said one metal sheet with the brazing material layer of the aluminum brazing sheet, the flat tube being brazed to said other metal sheet with a sheet of brazing material.

30. A liquid cooling radiator according to claim 27 wherein each of the two metal sheets comprises an aluminum brazing sheet having a brazing material layer on an inner surface thereof, and the flat tube comprises a bare aluminum material, each metal sheet having two portions including respective opposite ends of the flat tube and bulged outward over a length not smaller than the entire width of the flat tube, each of said opposite ends of the flat tube being positioned at a widthwise intermediate part of the corresponding bulged portion of each metal sheet, the flat tube being brazed to each metal sheet with the brazing material layer of the aluminum brazing sheet.

31. A liquid cooling radiator according to claim 24 wherein the heat transfer member comprises a corrugated fin having crest portions and furrow portions which extend longitudinally of the channel of the unit main body, and connecting portions interconnecting the crest portions and the furrow portions respectively.

32. A liquid cooling radiator according to claim 31 wherein the two metal sheets and the fin are each made of aluminum, and the two metal sheets are brazed to each other, the fin having its crest portions and furrow portions brazed to the respective metal sheets.

33. A notebook personal computer comprising a main body having a keyboard, and a display unit openably attached to the main body, the main body including a housing having disposed therein the liquid cooling radiator according to claim 11.

* * * * *